(12) United States Patent  
Canaris et al.

(10) Patent No.: US 7,505,887 B1  
(45) Date of Patent: Mar. 17, 2009

(54) BUILDING A SIMULATION OF DESIGN BLOCK USING A BUS FUNCTIONAL MODEL AND AN HDL TESTBENCH

(75) Inventors: John A. Canaris, Albuquerque, NM (US); Jorge Ernesto Carrillo, San Jose, CA (US); Lester S. Sanders, Albuquerque, NM (US); Yong Zhu, Albuquerque, NM (US)

(73) Assignee: Xilinx, Inc., San Jose, CA (US)

( * ) Notice: Subject to any disclaimer, the term of this patent is extended or adjusted under 35 U.S.C. 154(b) by 480 days.

(21) Appl. No.: 11/344,475

(22) Filed: Jan. 31, 2006

(51) Int. Cl.
*G06F 17/50* (2006.01)

(52) U.S. Cl. .............................. 703/14; 703/13; 703/15; 716/4; 716/5

(58) Field of Classification Search ............. 703/13–17; 716/4, 5
See application file for complete search history.

(56) References Cited

U.S. PATENT DOCUMENTS

| | | | |
|---|---|---|---|
| 7,124,376 B2 * | 10/2006 | Zaidi et al. ...................... | 716/1 |
| 7,315,803 B1 * | 1/2008 | Carrillo et al. ................. | 703/14 |
| 7,386,827 B1 * | 6/2008 | Zhu et al. ..................... | 716/16 |
| 2005/0229170 A1 * | 10/2005 | Bellantoni et al. .......... | 717/165 |

OTHER PUBLICATIONS

U.S. Appl. No. 11/055,275, filed Feb. 10, 2005, Carrillo et al.
Lester Sanders; "Using Xilinx m4 Functions to Write Bus Functional Language Stimuli for CoreConnect Buses"; Application Note: XAPP515; Feb. 22, 2006 (v1.0); available from www.xilinx.com; pp. 1-8.
Lester Sanders; "Bus Functional Model (BFM) Simulation of Processor Intellectual Property"; Application Note: XAPP516; Feb. 22, 2006 (v1.0); available from www.xilinx.com; pp. 1-8.

* cited by examiner

*Primary Examiner*—Kamini S Shah
*Assistant Examiner*—Herng-der Day
(74) *Attorney, Agent, or Firm*—LeRoy D. Maunu; Lois D. Cartier (57) ABSTRACT

Methods and systems for building a simulation for verifying a design block, including efficient coordination of the control and validation of the operation of a first and second bus of the design block, with the first bus being an interface bus of a processor. An interface description is determined for a bus functional model of the interface bus of the processor. The interface description includes a synchronization bus for coordinating the bus functional model and a hardware description language (HDL) testbench. A hardware specification is generated that couples the first bus of the design block with the interface description, and couples the HDL testbench with the second bus of the design block and with the synchronization bus of the interface description. The simulation for verifying the design block is automatically generated from the bus functional model and the hardware specification.

18 Claims, 6 Drawing Sheets

BUILDING A SIMULATION OF DESIGN BLOCK USING A BUS FUNCTIONAL MODEL AND AN HDL TESTBENCH

FIELD OF THE INVENTION

The present invention generally relates to simulation of electronic circuits.

BACKGROUND

The design of processor-based systems may include designing a design block that communicates with a processor via an interface bus of the processor. An example design block is a bridge between the protocol of the processor's interface bus and another communication protocol, such as Ethernet. An example processor is the IBM Power PC processor which is included in the Virtex-II Pro and Virtex-4 families of programmable logic devices (PLD) available from Xilinx, Incorporated. Another example processor is the Microblaze processor that may be implemented in the programmable logic and routing resources of a PLD. The IBM Power PC processor of Xilinx PLDs has the interface buses of IBM CoreConnect, including the Processor Local Bus, the On-Chip Peripheral Bus, and the Device Control Register bus. The Microblaze processor has the On-Chip Peripheral Bus for an interface bus.

The development of a design block for a processor-based system may include testing the design block using simulation of an example processor-based system. However, a simulation that includes a simulation of a processor may have a slow simulation speed due to the complexity of simulating the processor. In addition, the testing of a design block may require issuing particular transactions on the interface bus, and the processor may provide indirect control of the transactions issued on the interface bus, which may make the testing of a design block time-consuming and expensive. The testing of a design block may require issuing certain transactions on the interface bus that a specific normally functioning processor cannot issue, such as certain transactions with aborts, retries, and/or errors including bus parity errors.

A bus functional model may be a simplification of a processor that allows a direct specification of the transactions issued on the interface bus by the bus functional model. The bus functional model may also provide explicit control of exceptional conditions, such as aborts, retries, and errors. A simulation of a processor-based system using a bus functional model instead of a processor may have improved simulation speed. The bus functional model may also check every protocol rule of the interface bus and flag any violations of these protocol rules.

For a design block that is coupled to an interface bus of a processor and a second bus, a bus functional model could be used to control the interface bus, except that testing of the design block may require coordinated control and validation of both buses. For example, a defect in the design block may not cause improper operation on the processor's interface bus because the improper operation may only be evident on the second bus. Coordination of control and validation for a design block having a processor's interface bus and another bus may be time-consuming and expensive.

The present invention may address one or more of the above issues.

SUMMARY OF THE INVENTION

Various embodiments of the invention provide a method of building a simulation for verifying a design block within a software-based development tool for a programmable logic device. The design block has a first bus, which is an interface bus of a processor, and a second bus. An interface description is determined for a bus functional model of the interface bus of the processor. The interface description includes a synchronization bus for coordinating the bus functional model and a hardware description language (HDL) testbench. A hardware specification is generated that couples the first bus of the design block with the interface description, and couples the HDL testbench with the second bus of the design block and with the synchronization bus of the interface description. The simulation for verifying the design block is automatically generated from the bus functional model and the hardware specification.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which.

DETAILED DESCRIPTION

Figure 1:
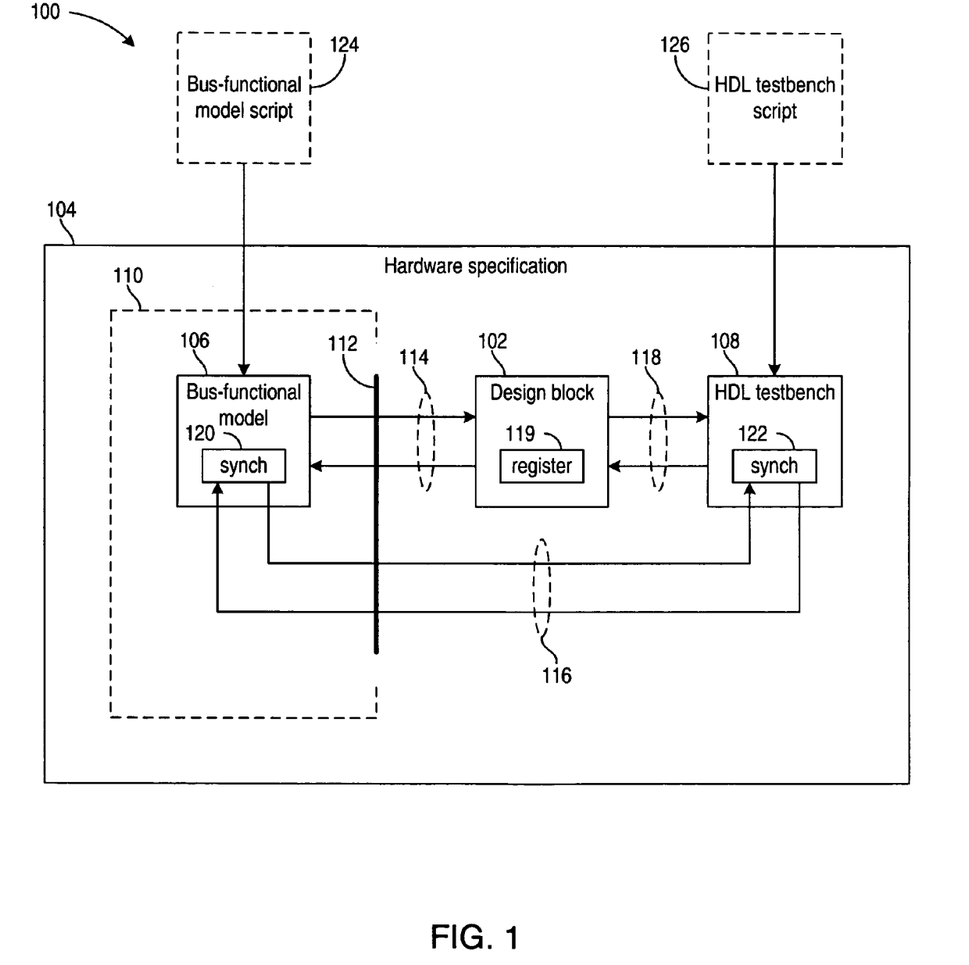
FIG. 1 is a block diagram of a simulation for verifying a design block in accordance with various embodiments of the invention.

FIG. 1 is a block diagram of a simulation 100 for verifying a design block 102 in accordance with various embodiments of the invention. A hardware specification 104 may describe the interconnections between the design block 102, a bus functional model 106, and a testbench 108 in a hardware description language (HDL), such as VHDL or Verilog.

In one embodiment, the bus functional model 106 may be specified in a software programming language, such as the C programming language. Simulating the bus functional model 106 that is specified in the C programming language in simulation 100 may require a programming language interface 110 for the bus functional model 106 in the simulation 100. In another embodiment, the bus functional model 106 is specified in an HDL for the simulation 100 and the programming language interface 110 may be omitted. Various embodiments of the invention automatically determine an interface description 112 in HDL for the bus functional model 106, with the interface description 112 including a processor bus 114 and a synchronization bus 116, which is used for coordinating the bus functional model 106 and the HDL testbench 108.

The design block 102 may be developed to be connected by the processor bus 114 to a corresponding processor. For example, the processor bus 114 may be the On-Chip Peripheral Bus of IBM CoreConnect and the corresponding processor may be an IBM Power PC processor as implemented on a Virtex-4 PLD from Xilinx, Incorporated. To enhance the efficiency of simulation and to provide direct control of the processor bus 114, the bus functional model 106 may be used to emulate the external behavior on the processor bus 114 of the corresponding processor. In addition, the bus functional model 106 may check for violations of the protocol for the processor bus 114 and issue a notification message upon detecting any protocol violations.

The design block 102 may also connect to a peripheral bus 118, for example, Ethernet, PCI, or a USB bus. The design block 102 may function as a bridge between the processor bus 114 and the peripheral bus 118. The HDL testbench 108 may control and check the operation of the peripheral bus 118 of the design block 102. Often, the HDL testbench 108 may be developed together with the development of the design block 102. In contrast, the bus functional model 106 is usually available and extensively tested prior to beginning the development of the design block 102 and the HDL testbench 108.

The testing of the design block 102 may require coordination of the bus functional model 106 and the HDL testbench 108. For example, a write transaction on peripheral bus 118 from the HDL testbench 108 may write a value to a register 119 in the design block 102, and this write transaction may be checked by issuing a read transaction from the bus functional model 106 on the processor bus 114 that reads the current value of this register 119 in the design block 102. The coordination of the bus functional model 106 and the HDL testbench 108 may involve issuing the read transaction on the processor bus 114 after the write transaction is issued to the peripheral bus 118. The synchronization bus 116 may communication synchronization signals that coordinate the operation of the bus functional model 106 and the HDL testbench 108. For example, after the write transaction is issued by the HDL testbench 108 on peripheral bus 118, an assignment completion signal may be communicated via the synchronization bus 116 from the HDL testbench 108 to the bus functional model 106. The bus functional model 106 may wait until the assignment completion signal is received before issuing a read transaction on the processor bus 114 to check whether the register 119 was properly written by the write transaction.

In one embodiment, the bus functional model 106 includes a synchronization function 120 and the HDL testbench 108 includes another synchronization function 122. A development system for generating the simulation 100 may have a software library that includes HDL routines for synchronization functions 120 and 122, and may also include routines for optional script-based control of the bus functional model 106 and the HDL testbench 108. In certain embodiments of the invention, the bus functional model 106 may have a script 124 that specifies the control and checking of the processor bus 114 by the bus functional model 106, and another script 126 that specifies the control and checking of the peripheral bus 118 by the HDL testbench 108.

Various embodiments of the invention automatically generate the interface description 112 of the bus functional model, and then automatically generate the hardware specification 104, including connecting the processor bus 114 between the interface description 112 and the design block 102, connecting the peripheral bus 118 between the design block 102 and the HDL testbench 108, and connecting the synchronization bus 116 between the interface description 112 and the HDL testbench 108.

Figure 2:
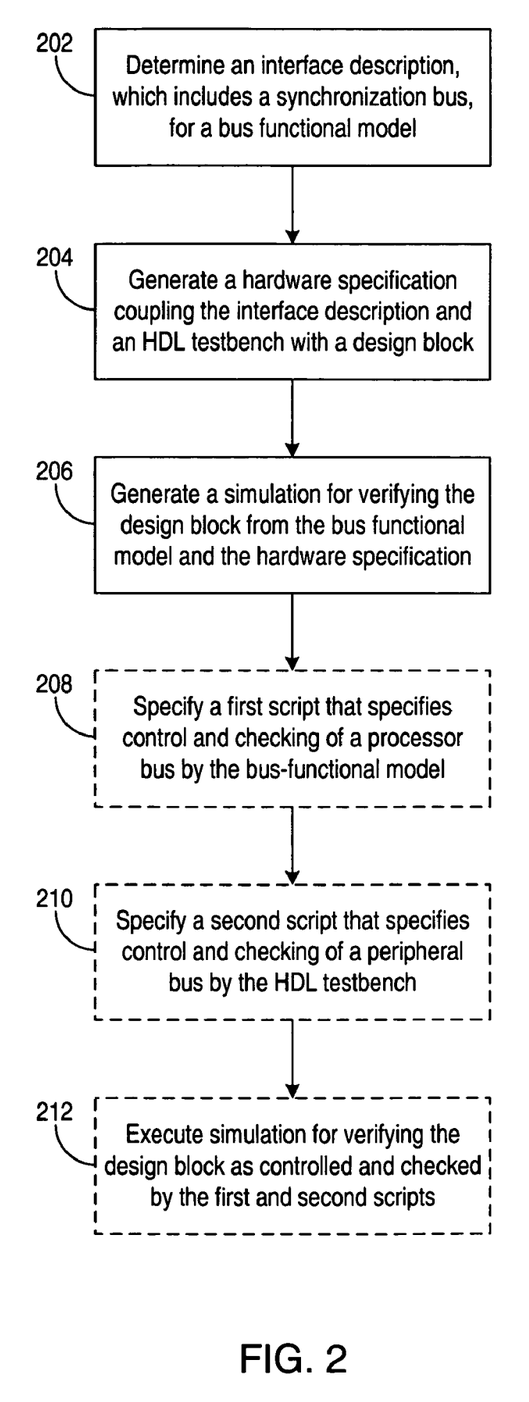
FIG. 2 is a flow diagram of a process for building a simulation for verifying a design block in accordance with various embodiments of the invention.

FIG. 2 is a flow diagram of a process for building a simulation for verifying a design block in accordance with various embodiments of the invention. The design block may have an interface for a processor bus and an interface for a peripheral bus. The simulation is built with a bus functional model controlling and/or checking the processor bus and with an HDL testbench controlling and/or checking the peripheral bus. The design block may be verified during execution of the simulation by applying test stimulus to the processor and/or peripheral bus, and checking the response of the design block on the processor and/or peripheral bus.

At step 202, an interface specification is generated for the bus functional model. A development system may execute software that automatically generates the interface specification from the specification of the bus functional model. The interface specification may include a reference to the bus functional model and a reference to a synchronization function from a software library. The interface specification may include a processor bus from the bus functional model and a synchronization bus from the synchronization function. During simulation, the operation of the bus functional model may be synchronized with the HDL testbench using the synchronization bus.

At step 204, a hardware specification is generated that instantiates the design block and the HDL testbench, and connects the design block, the HDL testbench, and the interface description of the bus functional model. The development system may execute software that automatically generates the hardware specification from the interface description and HDL specifications for the design block and the HDL testbench. The hardware specification may connect the processor bus between the interface description and the design block, the peripheral bus between the design block and the HDL testbench, and the synchronization bus between the interface description and the HDL testbench.

At step 206, a simulation is generated for verifying the design block. Generating the simulation may include linking the hardware specification with the bus functional model.

At optional step 208, a script is specified for the control and checking of the processor bus by the bus functional model, which may issue transactions to the design block and check transactions on the processor bus according to a sequence of commands in the script. At optional step 210, another script is specified for the control and checking of the peripheral bus by the HDL testbench, which may issue and check transactions on the peripheral bus according to a sequence of commands in the script. Both scripts may include synchronization commands for coordinating the operation of the bus functional model and the HDL testbench. Example commands are a write command to write a register of the design block and a read command to read a register of the design block. Either a write command or a read command may specify a corresponding transaction to be issued to the design block, and the read command may also specify an assertion of the expected data, which may be checked to match the actual data that is returned by the design block for the read command.

At optional step 212, the simulation generated in step 206 is executed to control and check the operation of the design block as specified in the scripts. Violation of any assertions from the scripts may indicate the presence of a defect in the design block or another part of the simulation. Verification of the design block may include generating a sufficient number of scripts such that all the features of the design block are exercised, and simulating and fixing discovered defects until every script can be simulated without error.

Figure 3:
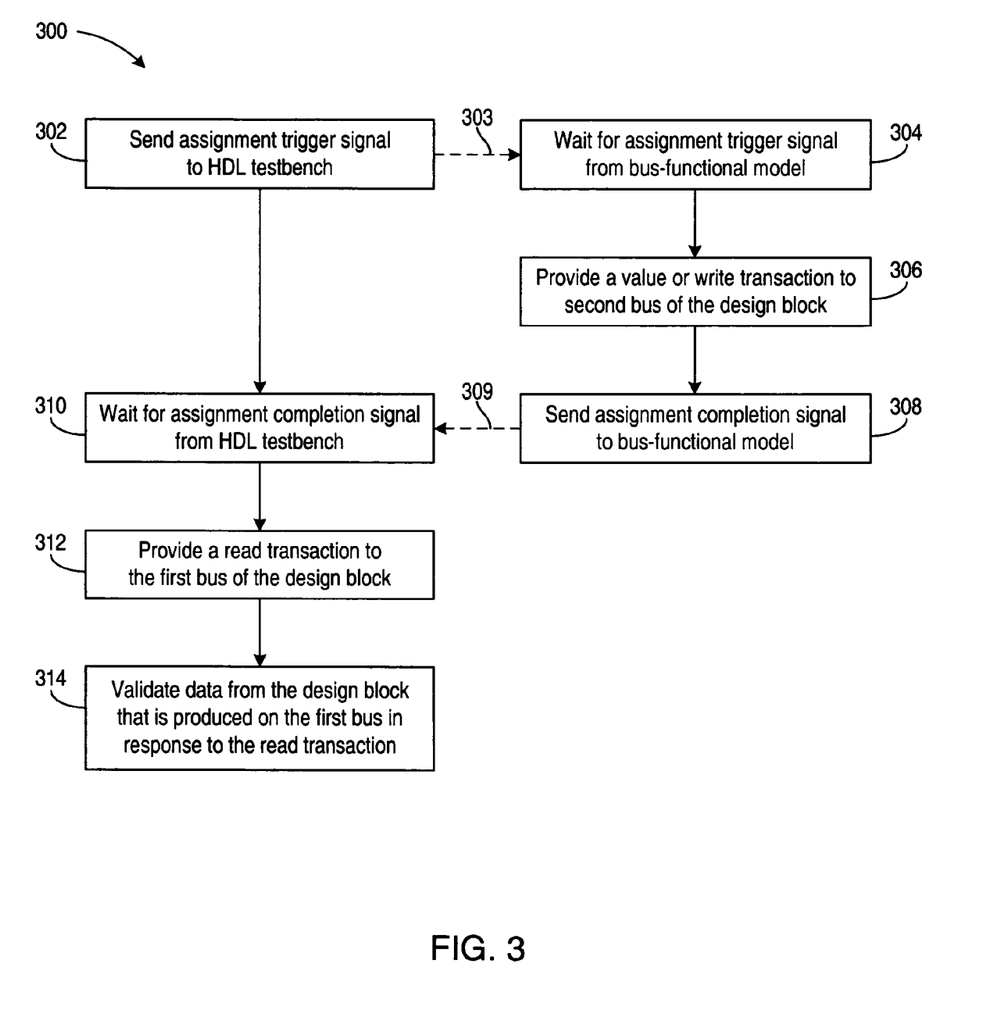
FIG. 3 is a flow diagram of a synchronized parallel process for an example of testing a design block in accordance with various embodiments of the invention.

FIG. 3 is a flow diagram of a synchronized parallel process 300 for an example of testing a design block in accordance with various embodiments of the invention. A bus functional model may have a script containing a sequence of respective commands for the steps 302, 310, 312, and 314, and an HDL testbench may have a corresponding script containing a sequence of respective commands for the steps 304, 306, and 308.

At step 302, an assignment trigger command in the script for the bus functional model directs the bus functional model to send an assignment trigger signal 303 to the HDL testbench via the synchronization bus. At step 310, a wait command directs the bus functional model to wait until an assignment completion signal 309 is received from the HDL testbench via the synchronization bus.

At step 304, a wait command of the script for the HDL testbench directs the HDL testbench to wait until the assignment trigger signal 303 is received from the bus functional model. When the assignment trigger signal 303 generated by the bus functional model at step 302 is received by the HDL testbench, process 300 proceeds from step 304 to step 306. At step 306, a write or other command directs the HDL testbench to issue a write transaction or otherwise issue a value to the design block on the peripheral bus. At step 308, an assignment completion command directs the HDL testbench to send an assignment completion signal 309 to the bus functional model.

When the assignment completion signal 309 generated by the HDL testbench at step 308 is received by the bus functional model, process 300 proceeds from step 310 to step 312. At step 312, a read command directs the bus functional model to issue a read transaction to the design block on the processor bus, and the read command may also specify the expected data to be returned by the design block. At step 314, the actual data returned by the design block may be compared with the assertion of the expected data. If the actual data does not match the expected data, or the design block does not respond to the read transaction, the bus functional model may issue a notification message for the violation.

The generation and waiting for synchronization signals may simplify the development of a test of the design block because parallel activity by the bus functional model and the HDL testbench can be eliminated through proper usage of the synchronization commands and corresponding synchronization signals. In certain scenarios, parallel activity by the bus functional model and the HDL testbench may lead to indeterminate behavior. For example, without the synchronization signal 309 a read at step 312 may occur either before or after a write at step 306, and the ordering of the read at step 312 and the write at step 306 may vary between multiple executions of the same scripts depending on the scheduling of activity within the simulation. The synchronization commands may be used to eliminate such indeterminate behavior. In addition, the synchronization commands are often used to simplify the control flow of the parallel execution of the scripts. The scripts can be written such that a single control flow is specified by generally having one script waiting for a synchronization signal while the other script is actively being processed. Because one or more synchronization signals may be sent and received at a particular simulation time, transactions may be issued on both the processor bus and the peripheral bus at the same simulation time even though only one script at a time is actively being processed.

Figure 4:
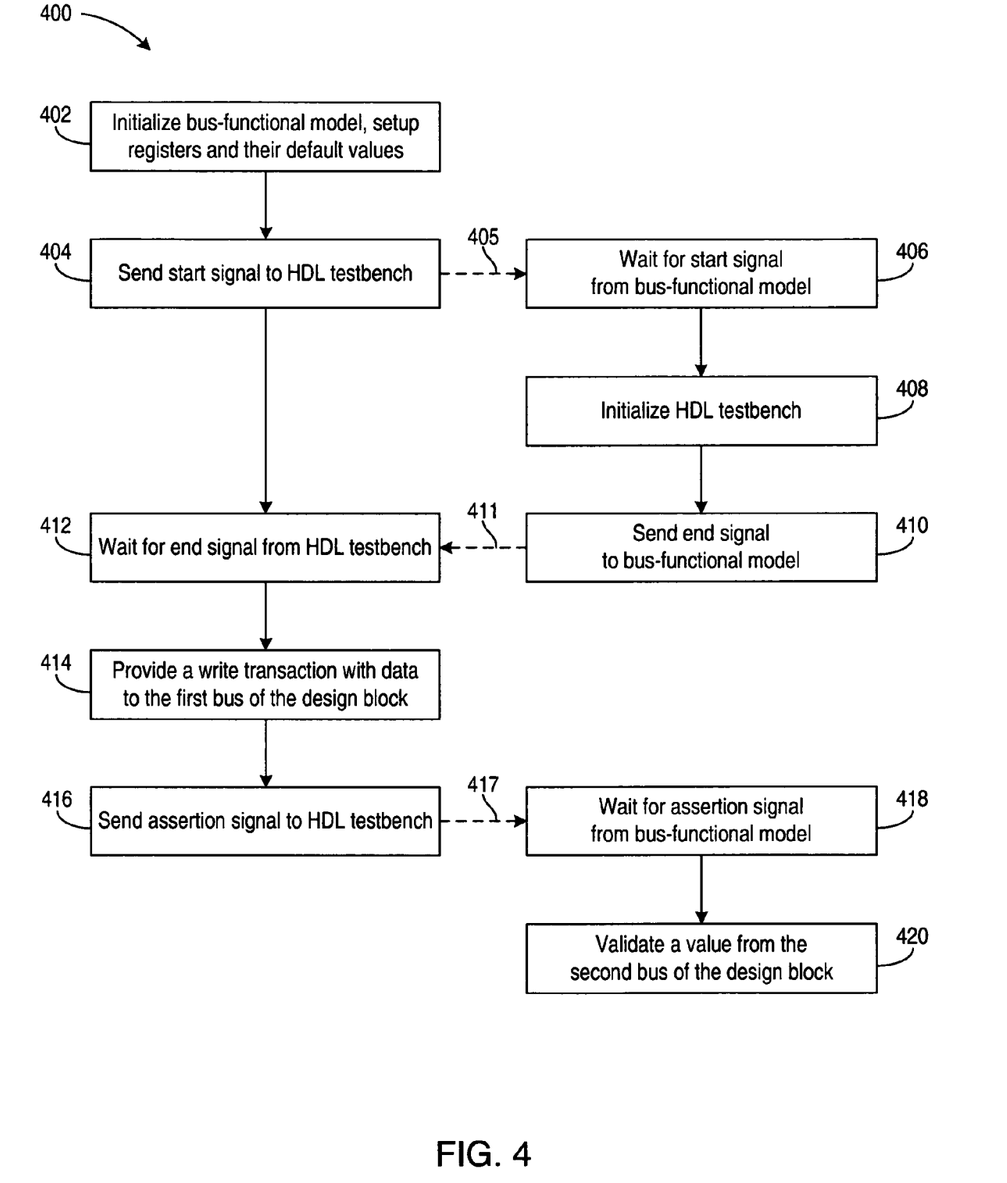
FIG. 4 is a flow diagram of synchronized parallel process for another example of testing a design block in accordance with various embodiments of the invention.

FIG. 4 is a flow diagram of synchronized parallel process 400 for another example of testing a design block in accordance with various embodiments of the invention. A bus functional model may have a script containing a sequence of respective commands for the steps 402, 404, 412, 414, and 416, and an HDL testbench may have a corresponding script containing a sequence of respective commands for the steps 406, 408, 410, 418, and 420.

At step 402, a script for the bus functional model may include commands to initialize the bus functional model and the synchronization of the bus functional model and the HDL testbench. The script may include commands that specify the register set that is implemented by the design block, including associating an address and a default value with each register, and the specified register set may be referenced by commands in the scripts for either the bus functional model or the HDL testbench. At step 404, a start command in the script for the bus functional model directs the bus functional model to send a start signal 405 to the HDL testbench via the synchronization bus. At step 412, a wait command directs the bus functional model to wait until an end signal 411 is received from the HDL testbench via the synchronization bus.

At step 406, a wait command of the script for the HDL testbench directs the HDL testbench to wait until the start signal 405 is received from the bus functional model. When the start signal 405 generated by the bus functional model at step 404 is received by the HDL testbench, process 400 proceeds from step 406 to step 408. The initialization of the HDL testbench at step 408 may require that the initialization of the bus functional model at step 402 is previously completed, and the sending and receiving of the start signal 405 at steps 404 and 406 may ensure that step 402 is completed before step 408 is begun. At step 410, an end command directs the HDL testbench to send an end signal 411 to the bus functional model.

When the end signal 411 generated by the HDL testbench at step 410 is received by the bus functional model, process 300 proceeds from step 412 to step 414. The initialization of both the bus functional model and the HDL testbench may need to be completed before issuing the transactions that test the design block, and the sending and receiving of the end signal 411 at steps 410 and 412 may ensure that initialization is complete before beginning step 414. At step 414, a write command directs the bus functional model to issue a write transaction with data on the processor bus. At step 416, an assertion command in the script for the bus functional model directs the bus functional model to send an assertion signal 417 to the HDL testbench.

At step 418, a wait command of the script for the HDL testbench directs the HDL testbench to wait until the assertion signal 417 is received from the bus functional model. When the assertion signal 417 generated by the bus functional model at step 416 is received by the HDL testbench, process 400 proceeds from step 418 to step 420. At step 420, a value on the peripheral bus from the design block is validated. The value may be issued by the design block in response to the write transaction of step 414, or a read command may read a value that is set by the write transaction of step 414.

Figure 5:
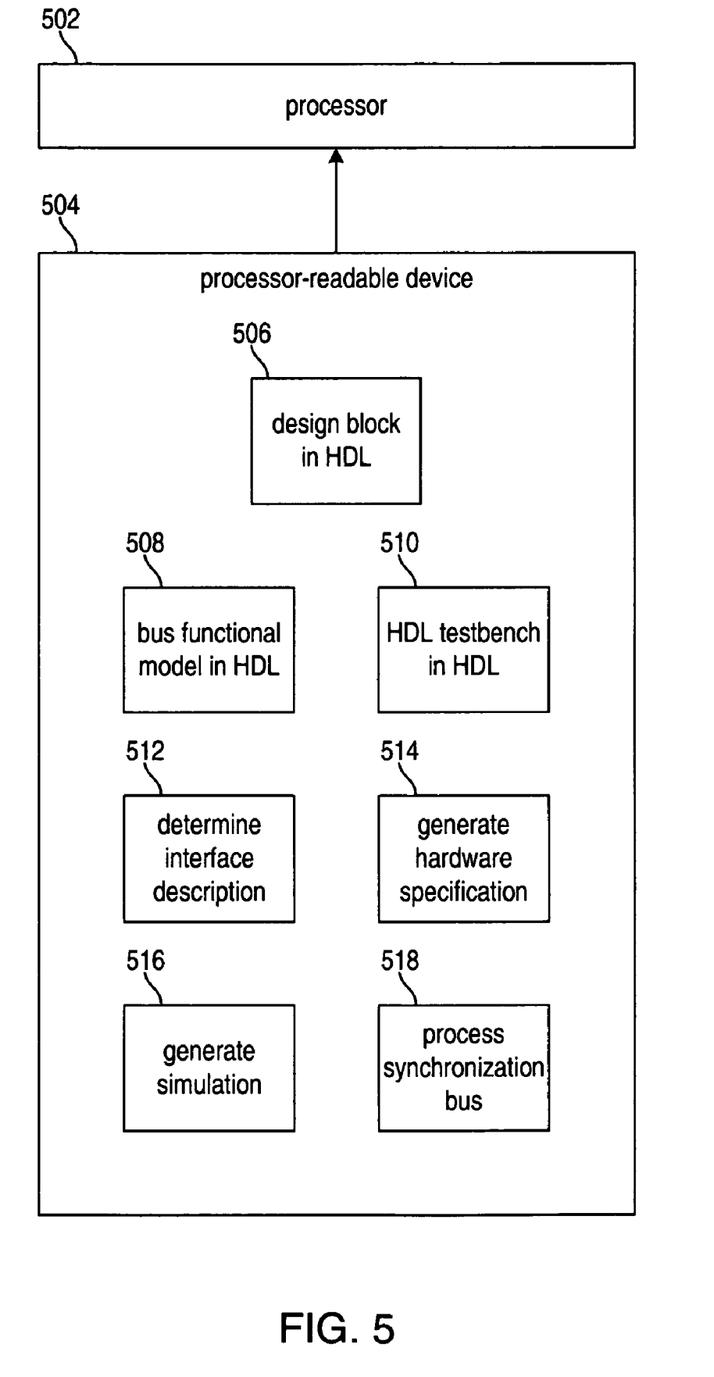
FIG. 5 is a block diagram of a system that constructs a simulation for verifying a design block in accordance with various embodiments of the invention.

FIG. 5 is a block diagram of a system that constructs a simulation for verifying a design block in accordance with various embodiments of the invention. The system includes a processor 502 and a processor-readable device 504, for example, magnetic or optical disks or tapes and electronic storage devices. The processor-readable device is configured with instructions, and processor 502 performs various operations during execution of the instructions.

The instructions of processor-readable device 504 may be included in modules 506 through 518. The instructions may be machine instructions of the processor 502 or interpreted instructions, such as a specification of the design block in a hardware description language (HDL) that is interpreted by a simulator, such as Modelsim from Model Technology, Incorporated.

Module 506 may include instructions that specify the operation of a design block in an HDL. Similarly, module 508 may include instructions that specify the operation of the bus functional model in an HDL, and module 510 may include instructions that specify the operation of the HDL testbench in an HDL.

Module 512 may include instructions that determine the interface description of the bus functional model, and in certain embodiments module 512 may include instructions for determining the interface description of any module specified in an HDL and/or another language. Module 514 may include instructions that generate a hardware specification in an HDL that describes the interconnections between the design block, a bus functional model 106, and an HDL testbench for a simulation for verifying the design block. Module 516 generates the simulation for verifying the design block from the design block, the bus functional model, the HDL testbench, and the hardware specification. Coordination of the operation of the bus functional model and the HDL testbench may be provided by the instructions of module 518 that process the synchronization signals of the synchronization bus between the bus functional model and the HDL testbench.

Figure 6:
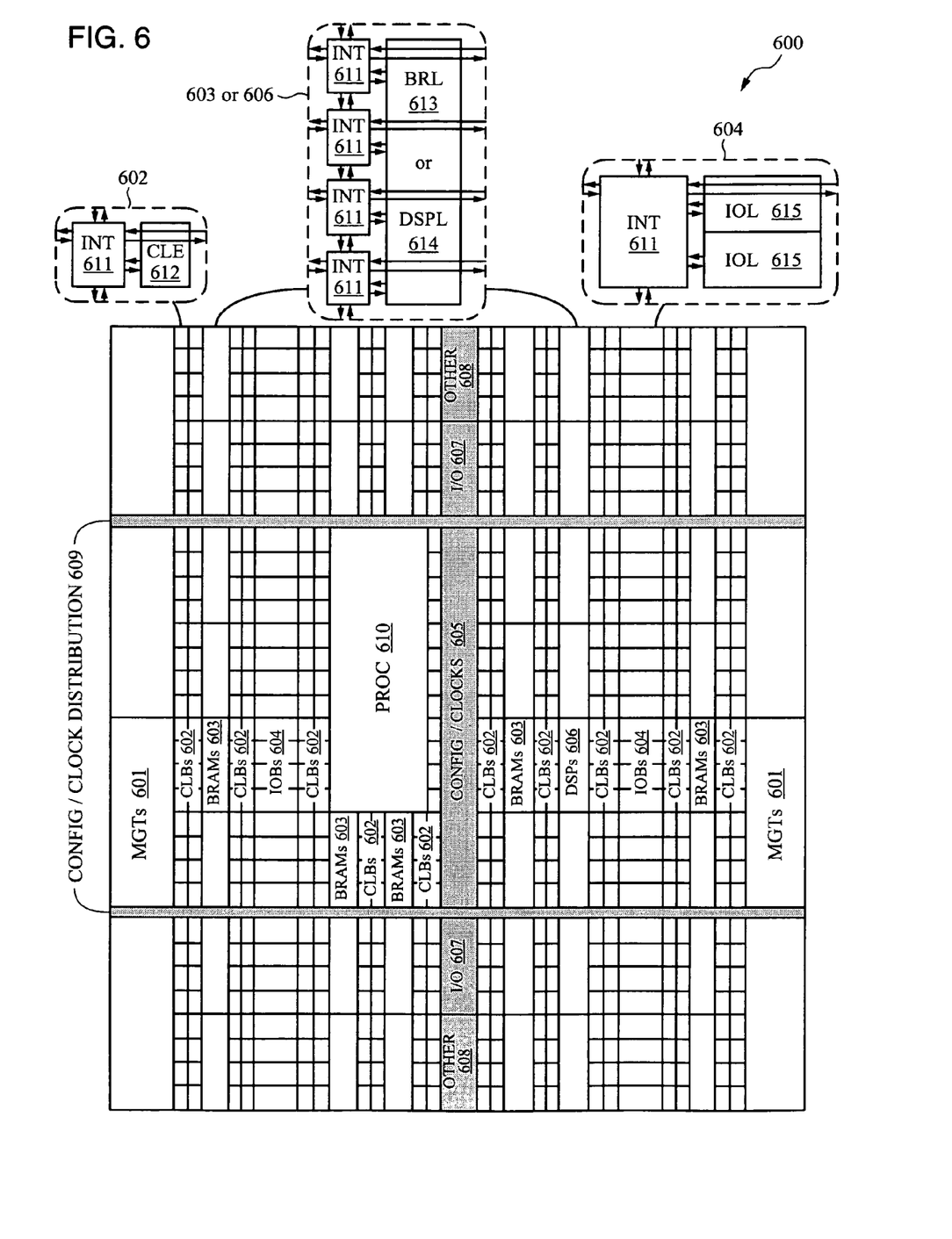
FIG. 6 is a block diagram of a programmable logic device (PLD) that may be used to implement a design block that is simulated in accordance with various embodiments of the invention.

FIG. 6 is a block diagram of a programmable logic device (PLD) that may be used to implement a design block that is simulated in accordance with various embodiments of the invention. Development of the design block for implementation in the PLD may include simulating the behavior of the design block using a bus functional model and an HDL testbench. Various embodiments of the invention provide methods and systems for constructing a simulation for verifying within a software-based development tool for a programmable logic device.

Advanced FPGAs can include several different types of programmable logic blocks in the array. For example, FIG. 6 illustrates an FPGA architecture 600 that includes a large number of different programmable tiles including multi-gigabit transceivers (MGTs 601), configurable logic blocks (CLBs 602), random access memory blocks (BRAMs 603), input/output blocks (IOBs 604), configuration and clocking logic (CONFIG/CLOCKS 605), digital signal processing blocks (DSPs 606), specialized input/output blocks (I/O 607) (e.g., configuration ports and clock ports), and other programmable logic 608 such as digital clock managers, analog-to-digital converters, system monitoring logic, and so forth. Some FPGAs also include dedicated processor blocks (PROC 610).

In some FPGAs, each programmable tile includes a programmable interconnect element (INT 611) having standardized connections to and from a corresponding interconnect element in each adjacent tile. Therefore, the programmable interconnect elements taken together implement the programmable interconnect structure for the illustrated FPGA. The programmable interconnect element (INT 611) also includes the connections to and from the programmable logic element within the same tile, as shown by the examples included at the top of FIG. 6.

For example, a CLB 602 can include a configurable logic element (CLE 612) that can be programmed to implement user logic plus a single programmable interconnect element (INT 611). A BRAM 603 can include a BRAM logic element (BRL 613) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 606 can include a DSP logic element (DSPL 614) in addition to an appropriate number of programmable interconnect elements. An IOB 604 can include, for example, two instances of an input/output logic element (IOL 615) in addition to one instance of the programmable interconnect element (INT 611). As will be clear to those of skill in the art, the actual I/O pads connected, for example, to the I/O logic element 615 are manufactured using metal layered above the various illustrated logic blocks, and typically are not confined to the area of the input/output logic element 615.

In the pictured embodiment, a columnar area near the center of the die (shown shaded in FIG. 6) is used for configuration, clock, and other control logic. Horizontal areas 609 extending from this column are used to distribute the clocks and configuration signals across the breadth of the FPGA.

Some FPGAs utilizing the architecture illustrated in FIG. 6 include additional logic blocks that disrupt the regular columnar structure making up a large part of the FPGA. The additional logic blocks can be programmable blocks and/or dedicated logic. For example, the processor block PROC 610 shown in FIG. 6 spans several columns of CLBs and BRAMs.

Note that FIG. 6 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 6 are purely exemplary. For example, in an actual FPGA more than one adjacent column of CLBs is typically included wherever the CLBs appear, to facilitate the efficient implementation of user logic.

The present invention is thought to be applicable to a variety of systems for generating simulation models. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. Within a software-based development tool, a computer-implemented method of building a simulation for verifying a design block having an interface to a first bus, which is an interface bus of a processor, and an interface to a second bus, the method comprising:

determining an interface description for a bus functional model of the interface bus of the processor, wherein the interface description includes a synchronization bus for coordinating the bus functional model and a hardware description language (HDL) testbench;

generating a hardware specification, which couples the first bus with the interface description, couples the HDL testbench with the second bus and with the synchronization bus of the interface description;

automatically generating the simulation for verifying the design block from the bus functional model and the hardware specification;

executing the simulation by a computer for verifying the design block; and storing results of the executed simulation.

2. The method of claim 1 further comprising specifying a first and second scripts, wherein the first script specifies control and checking of the first bus by the bus functional model, and the second script specifies control and checking of the second bus by the HDL testbench.

3. The method of claim 2 wherein specifying the first and second scripts includes specifying a set of registers of the design block and a corresponding textual name for each of the registers, and specifying a sequence of a plurality of transactions including at least one of a read transaction and a write transaction to one of the registers specified abstractly using the corresponding textual name.

4. The method of claim 2, wherein the specifying of the first and second scripts includes specifying at least one first synchronization command in the first script and specifying a corresponding at least one second synchronization command in the second script.

5. The method of claim 4, wherein the at least one first synchronization command includes at least one of a start synchronization command and an assignment-trigger synchronization command, and the at least one second synchronization command includes at least one of an end synchronization command, an assignment-completion synchronization command, and an assertion synchronization command.

6. The method of claim 2, wherein the specifying the first and second scripts includes specifying a first synchronization command in one of the first and second scripts and a corresponding second synchronization command in another one of the first and second scripts, the first synchronization command completed in response to the corresponding second synchronization command.

7. The method of claim 2, wherein the specifying the first and second scripts includes specifying a synchronization command in one of the first and second scripts that is completed in response to a synchronization signal, and specifying a corresponding synchronization command in another one of the first and second scripts that generates the synchronization signal.

8. The method of claim 7, wherein the synchronization signal is one of a plurality of synchronization signals conveyed between the bus functional model and the HDL testbench by the synchronization bus.

9. The method of claim 2, wherein the first script specifies checking the first bus by the bus functional model in response to a synchronization command specified in the second script for the HDL testbench.

10. The method of claim 9, wherein the first script specifies, in response to an assignment-completion synchronization command specified in the second script, providing a read transaction to the first bus that reads a register of the design block and checking a return value from the first bus for the read transaction.

11. The method of claim 2, wherein the second script specifies checking the second bus by the HDL testbench in response to a synchronization command specified in the first script for the bus functional model.

12. The method of claim 11, wherein the second script specifies, in response to an assertion synchronization command specified in the first script, checking a value from the second bus.

13. The method of claim 2, wherein the first script specifies providing a value to the first bus by the bus functional model in response to a synchronization command specified in the second script for the HDL testbench.

14. The method of claim 13, wherein the first script specifies, in response to the synchronization command specified in the second script, providing a read transaction to the first bus that reads a register of the design block.

15. The method of claim 13, wherein the first script specifies, in response to the synchronization command specified in the second script, providing a write transaction to the first bus that writes a register of the design block.

16. The method of claim 2, wherein the second script specifies providing a value to the second bus by the HDL testbench in response to a synchronization command specified in the first script for the bus functional model.

17. A system for constructing a simulation for verifying a design block having an interface to a first bus, which is an interface bus of a processor, and an interface to a second bus, the system comprising:
a computer; and
a storage device coupled to the computer and storing instructions for causing the computer to perform the operations including:
determining an interface description for a bus functional model of the interface bus of the processor, wherein the interface description includes a synchronization bus for coordinating the bus functional model and a hardware description language (HDL) testbench;
generating a hardware specification, which couples the first bus with the interface description, couples the HDL testbench with the second bus and with the synchronization bus of the interface description;
automatically generating the simulation for verifying the design block from the bus functional model and the hardware specification;
executing the simulation for verifying the design block; and
storing results of the executed simulation.

18. A program storage medium, comprising:
a computer-readable device configured with instructions for constructing a simulation for verifying a design block, wherein execution of the instructions by one or more computers causes the one or more computers to perform operations including:
determining an interface description for a bus functional model of an interface bus of a processor, wherein the interface description includes a synchronization bus for coordinating the bus functional model and a hardware description language (HDL) testbench;
generating a hardware specification, which couples the interface bus with the interface description, couples the HDL testbench with a second bus and with the synchronization bus of the interface description;
automatically generating the simulation for verifying the design block from the bus functional model and the hardware specification;
executing the simulation for verifying the design block; and
storing results of the executed simulation.

* * * * *